US008916796B2

(12) United States Patent
Ramanujan et al.

(10) Patent No.: US 8,916,796 B2
(45) Date of Patent: Dec. 23, 2014

(54) METHOD FOR DEPOSITING AND CURING NANOPARTICLE-BASED INK

(75) Inventors: Sujatha Ramanujan, Pittsford, NY (US); Michael J. Carmody, Webster, NY (US); Richard J. Dixon, Swindon (GB)

(73) Assignee: Intrinsiq Materials, Inc., Rochester, NY (US)

( * ) Notice: Subject to any disclaimer, the term of this patent is extended or adjusted under 35 U.S.C. 154(b) by 375 days.

(21) Appl. No.: 13/596,109

(22) Filed: Aug. 28, 2012

(65) Prior Publication Data

US 2013/0337190 A1      Dec. 19, 2013

Related U.S. Application Data

(60) Provisional application No. 61/661,378, filed on Jun. 19, 2012.

(51) Int. Cl.
 *B23K 26/08* (2014.01)
 *B23K 26/20* (2014.01)
 *C23C 16/48* (2006.01)

(52) U.S. Cl.
 USPC ............... 219/121.6; 219/121.76; 250/492.1; 250/492.2

(58) Field of Classification Search
 CPC ....... B23K 26/08; B23K 26/20; C23C 16/483
 USPC ............... 219/121.6, 121.65, 121.66, 121.76, 219/121.85; 250/492.1, 492.2; 438/662; 427/555; 118/641; 419/8, 9; 264/497; 347/224; 430/324
 See application file for complete search history.

(56) References Cited

U.S. PATENT DOCUMENTS

| | | | |
|---|---|---|---|
| 5,521,748 A | 5/1996 | Sarraf | |
| 5,619,245 A | 4/1997 | Kessler et al. | |
| 7,276,385 B1 * | 10/2007 | MacKenzie et al. | 438/4 |
| 7,682,970 B2 * | 3/2010 | Grigoropoulos et al. | 438/662 |
| 7,722,422 B2 * | 5/2010 | Cok | 445/23 |
| 8,820,236 B2 * | 9/2014 | Beier et al. | 101/424.1 |

OTHER PUBLICATIONS

Pique, Birnbaum, Kim, Wang, Charipar, Auyeung, Mathews, "Printing of Electronic Nanoinks by Laser Forward Transfer", Society for Imaging Science and Technology, International Conference on Digital Printing Technologies and Digital Fabrication 2010, Austin TX, pp. 730-733.
Kurtz, Andrew F., "Optical Systems for Laser Thermal Printing", Proc. SPIE 5525, Laser Beam Shaping V, 11 (Sep. 29, 2004); pp. 11-30.

(Continued)

*Primary Examiner* — Samuel M Heinrich
(74) *Attorney, Agent, or Firm* — Louis S. Horvath

(57) ABSTRACT

An apparatus for forming a pattern of a nanoparticle-based ink on a substrate has a printing apparatus that is energizable to deposit the nanoparticle-based ink in a pattern on a surface of the substrate. An illumination apparatus is energizable to direct a patterned illumination to cure the deposited ink pattern on the substrate, the illumination apparatus having an array having at least a first and a second laser diode, each laser diode coupled to a channel in a laser light coupling element through an optical fiber and having an illumination lens disposed to direct illumination from the coupling element onto the surface of the substrate. A transport apparatus is energizable to provide relative motion between the substrate and the illumination apparatus.

16 Claims, 9 Drawing Sheets

(56) References Cited

OTHER PUBLICATIONS

Baek, Burberry,Cuffney,Elzur,Feller,Fedorovskaya, Kerr, Rowley, Spath, Tutt, Warner, "Maskless Lithography and Electronic Patterning for Display Application", Proceedings of Asia Display 2007 Digest vol. 1, pp. 1-4.

Baek, Kessler,Haas, Kay, Sanger, "Multi-Channel Laser Thermal Printhead Technology", from Chapter 14, Handbook of Optical and Laser Scanning, G.F. Marshall, ed., Marcel Dekker 2004. pp. 1-34.

Pique, Arnold, Wartena, Weir, Pratap,Swider-Lyons, Kant, Chrisey, "Laser-Induced Forward Transfer Direct-Write of Miniature Sensor and Microbattery Systems" LAMP 2002, pp. 1-7.

\* cited by examiner

METHOD FOR DEPOSITING AND CURING NANOPARTICLE-BASED INK

CROSS-REFERENCE TO RELATED APPLICATIONS

This application claims the benefit of U.S. Provisional Patent Application Ser. No. 61/661,378, filed on Jun. 19, 2012, entitled "A METHOD FOR DEPOSITING AND SINTERING NANO PARTICLE BASED INK" in the names of Sujatha Ramanujan et al., the contents of which are incorporated fully herein by reference.

FIELD OF THE INVENTION

This invention relates in general to an apparatus and method for depositing electronic ink onto media, and sintering the ink by means of a spatially and temporally modulating a light beam.

BACKGROUND

Fabrication of mass-produced electronic items typically involves temperature- and atmosphere-sensitive processing. Conventional material deposition systems for electronic fabrication, including plasma-enhanced chemical vapor deposition PECVD and other vacuum deposition processes, rely on high temperatures and rigidly controlled ambient conditions. Conventional processes are typically subtractive, applying a conductive or other coating over a surface, treating the coating to form a pattern, then removing unwanted material. The conventional method for forming copper traces is one example of this process, requiring multiple processing steps with the use of toxic chemicals and the complications and cost of proper waste disposal.

Recent advances in printed electronics provide solutions that reduce the cost, complexity, and energy requirements of conventional deposition methods and expand the range of substrate materials that can be used. For printed electronics, materials can be deposited and cured at temperatures compatible with paper and plastic substrates and can be handled in air. In particular, advances with nanoparticle-based inks, such as silver, copper, and other metal nanoparticle-based inks, for example, make it feasible to print electronic circuit structures using standard additive printing systems such as inkjet and screen printing systems. Advantageously, nanoparticle-based inks have lower curing temperatures than those typically needed for bulk curing where larger particles of the same material are used.

Commercially available systems for curing nanoparticles typically employ heat from convection ovens or Xenon flash illumination energy. In such illumination systems, the Xenon lamps emit pulsed light that is directed onto films of nanoparticles to be cured. High light energy levels are required for nanoparticle curing. Exemplary nanoparticle-based inks such as Intrinsiq Material Ltd. CI-002, a copper nanoparticle based inkjet ink, or CP-001, a copper nanoparticle-based screen print ink, can be sintered through the use of photonic energy from Xenon lamp or other illumination, provided that the illumination system delivers adequate energy to volatilize coatings used in the ink formulations and to sinter and cure the inks over large surface areas.

Conventional approaches for conditioning of the nanoparticle material, however, suffer from a number of deficiencies. Xenon lamp emission is characteristically distributed over a broad range of wavelengths and often includes wavelengths that can cause unwanted effects, even at non-peak energy levels. This inherent spectral spread in Xenon lamp emission can have effects that result in incomplete or uneven curing. One result can be limited penetration of light energy into thicker films or premature sealing of top surface layers, trapping unwanted organic species in the remaining structure. This type of problem can occur when higher frequency light, such as light energy from the tail of the spectral distribution, inadvertently sinters the film and renders its top layers opaque to other wavelengths of emitted Xenon light, delaying or preventing curing of the lower layers. When this happens, the binder or organic suspension in which nanoparticles are suspended is only partially removed, causing uneven sintering, which can limit the conductivity of the applied materials.

With Xenon light, the distribution of energy intensity is non-symmetrical; the co-lateral dispersive energy that is produced can reduce curing efficiency or may even cause overheating and damage to the substrate. Further, pulsing of the Xenon lamp or other light source tends to create high energy peaks that can ablate films rather than melt and reflow films. As a result, the cured product may not have the desired structure.

Conventional methods are also limited with respect to the number of substrates that can be used. With materials having high thermal conductivity, such as aluminum, silicon, and ceramics, the applied energy intended for curing may dissipate too quickly. With such materials, heat can be drawn away from the area of incident light before sintering occurs. Furthermore, particular wavelengths emitted from the Xenon lamps can damage some polymeric films and other substrates, making them less suitable for curing.

Thus, it can be seen that there is a need for improved methods for sintering and curing nanoparticulate inks and similar materials.

SUMMARY OF THE INVENTION

It is an object of the present invention to advance the art of sintering and curing nanoparticle-based inks. With this object in mind, embodiments of the present invention provide an apparatus for forming a pattern of a nanoparticle-based ink on a substrate, the apparatus comprising:

a printing apparatus that is energizable to deposit the nanoparticle-based ink in a pattern on a surface of the substrate;

an illumination apparatus that is energizable to direct a patterned illumination to cure the deposited ink pattern on the substrate, the illumination apparatus having:

(i) an array having at least a first and a second laser diode, each laser diode coupled to a channel in a laser light coupling element through an optical fiber; and (ii) an illumination lens disposed to direct illumination from the coupling element onto the surface of the substrate;

and a transport apparatus that is energizable to provide relative motion between the substrate and the illumination apparatus.

Among advantages provided by embodiments of the present invention is the ability to direct sintering or curing energy in a pattern that corresponds to the pattern of the printed ink Wavelength selectivity is also improved over conventional curing methods, enabling more efficient curing and facilitating deposition and curing of multiple materials. Embodiments of the present invention may use one or more exposure levels for sintering nanoparticle materials.

These and other aspects, objects, features and advantages of the present invention will be more clearly understood and

DETAILED DESCRIPTION OF THE INVENTION

Figure 1A:
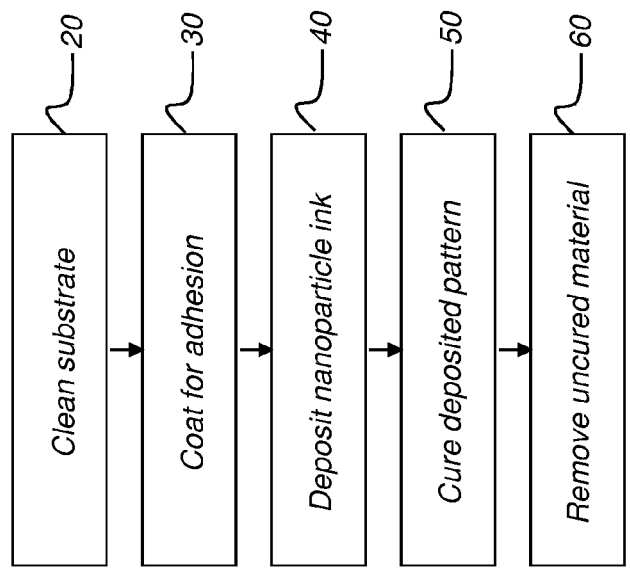
FIG. 1A is a flow chart showing a sequence for printing and curing nano-materials for electronic applications, according to an embodiment of the present invention.

The following is a detailed description of the preferred embodiments of the invention, reference being made to the drawings in which the same reference numerals identify the same elements of structure in each of the several figures. It is understood that the elements not shown specifically or described may take various forms well know to those skilled in the art.

Where they are used, the terms "first", "second", and so on, do not necessarily denote any ordinal or priority relation, but may be used for more clearly distinguishing one element or time interval from another.

In the context of the present disclosure, the term "ink" is a term of art that broadly applies to a material that is deposited in a pattern on a substrate in a viscous, generally fluid form and is sintered and otherwise cured after deposition by applying a curing energy such as heat or light energy. Sintering is a curing process by which curing energy effects a structural change in the composition of particles in the ink. Curing may also have additional aspects for ink conditioning, such as sealing or removal of organic coatings or other materials provided in the ink formulation but not wanted in the final, printed product. In the context of the present invention, the term "curing" is used to include sintering as well as other curing processes that employ the applied light energy for conditioning the deposited ink.

The terms "nanoparticle-based material", "nanoparticle-based ink", "nanoparticle material" or "nanoparticulate material" refer to an ink or other applied viscous fluid that has an appreciable amount of nanoparticulate content, such as more than about 5% by weight or volume.

In the context of the present invention, the term "substrate" refers to any of a range of materials upon which the nanoparticle ink is deposited for curing. Exemplary substrates include plastics, textiles, paper, sheet materials, and other materials that provide a suitable surface for depositing a pattern of nanoparticle-based ink.

As used herein, the term "energizable" relates to a device or set of components that perform an indicated function upon receiving power and, optionally, upon receiving an enabling signal.

The background section outlines a number of problems with conventional methods for sintering using Xenon light and other broadband light energy. Embodiments of the present invention address the problem of curing and sintering for nanoparticle-based materials using an array of one or more diode lasers, preferably arranged in series. Each laser in the array emits a continuous or quasi-continuous beam for nanoparticle curing. According to embodiments of the present invention, the laser diode array is arranged so that the emitted laser energy extends across the width of a substrate, allowing single-pass curing of high volumes of material. Alternate embodiments enable curing in a swath that does not fully extend across the width of the substrate.

There are a number of challenges that complicate the task of using laser diodes for this purpose. One problem relates to the speed at which laser diodes can be shuttled to deliver the necessary energy. Other difficulties relate to limitations of the laser devices themselves. For example, placing a bank of lasers in close proximity to a printing surface can lead to optical feedback, jitter and other destabilizing effects. Yet another challenge for a laser based system relates to delivery of uniform, dense, and addressable pixilation in illumination.

Laser thermal printing systems have been disclosed that use a fiber coupled diode array for dye sublimation and transfer. U.S. Pat. No. 5,619,245, entitled "MULTI-BEAM OPTICAL SYSTEM USING LENSLET ARRAYS IN LASER MULTI-BEAM PRINTERS AND RECORDERS" to Kessler et al., for example, describes a multi-beam laser printhead using a monolithic array of independently modulated diode lasers. Systems of this type deliver laser energy with acceptable beam quality and energy characteristics for transfer of a colorant from a donor to a recipient medium using ablation or other mechanisms. Optical characteristics such as depth of focus are optimized for colorant transfer with these printheads. Registration and alignment of the printhead to the donor and recipient media are tightly controlled in this type of donor transfer printing apparatus, with tight constraints on substrate spacing and handling. Energy levels that are locally generated for donor ablation are quite high, suitable for depositing a high-resolution array of colorant dots, but significantly exceeding those needed for curing of applied nanoparticulate inks.

According to an aspect of the invention there is provided a method of printing high resolution electronic features by depositing a pattern of nanoparticle-based ink onto a substrate and then curing the deposited pattern using fiber-coupled diode laser-based curing.

The flow diagram of FIG. 1A shows a sequence of steps for a printing and curing method 10 for nanoparticle-based inks according to an embodiment of the present invention. This method includes: pretreating the substrate in a washing or cleaning step 20, depositing adhesion promoting material in an optional coating step 30, depositing a pattern of nanoparticle ink in a printing step 40; illuminating the pattern of deposited ink to transform the ink by sintering and other curing processes using a laser diode array in a curing step 50; and removing the untransformed ink and residual materials in a removal step 60. Removal step 60 also includes evaporating and exhausting excess material from the applied and cured ink or coating.

Figure 1B:
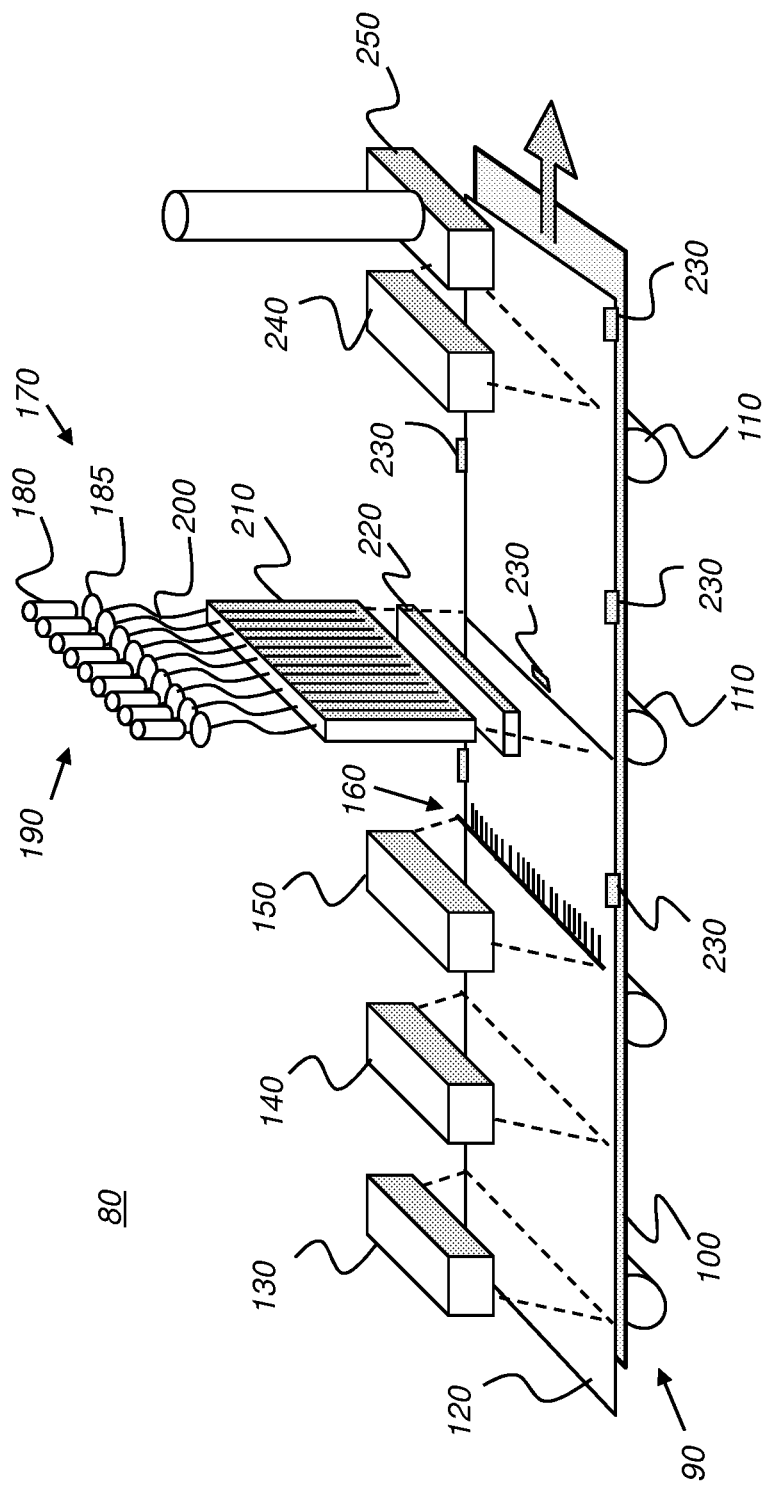
FIG. 1B is a schematic diagram showing a printing and curing system for use with electronic ink.

The schematic diagram of FIG. 1B shows a printing and curing system 80. The printing and curing system 80 has a substrate 120 on which material is printed, a transport apparatus 90 with devices such as rollers 110 or other components for providing relative movement between printing and curing components and substrate 120, a mount for substrate 120 which may include a heat sink or temperature control element 100 designed to maintain substrate 120 at a suitable temperature at specific points in the process, an optional substrate cleaning apparatus 130, an optional coating apparatus 140, a printing apparatus 150 that is energizable for deposition of the nanoparticulate electronic material, such as using inkjet or screen print mechanisms, creating a pattern of printed elements 160 on the substrate 120 surface. An illumination apparatus 170 has two or more energizable laser diodes 180, each with its corresponding coupling optics 185 that direct light through a corresponding light guide, shown as an optical fiber 200. Light from fibers 200 goes through a coupling block 210 and to an illumination lens 220 for directing a pattern of illumination that corresponds to the pattern of printed elements 160 on substrate 120. A washing apparatus 240 can be energized to perform a cleaning operation to remove uncured ink or other material. An exhaust element 250 is provided to help remove by-products of the printing and curing process.

Figure 1C:
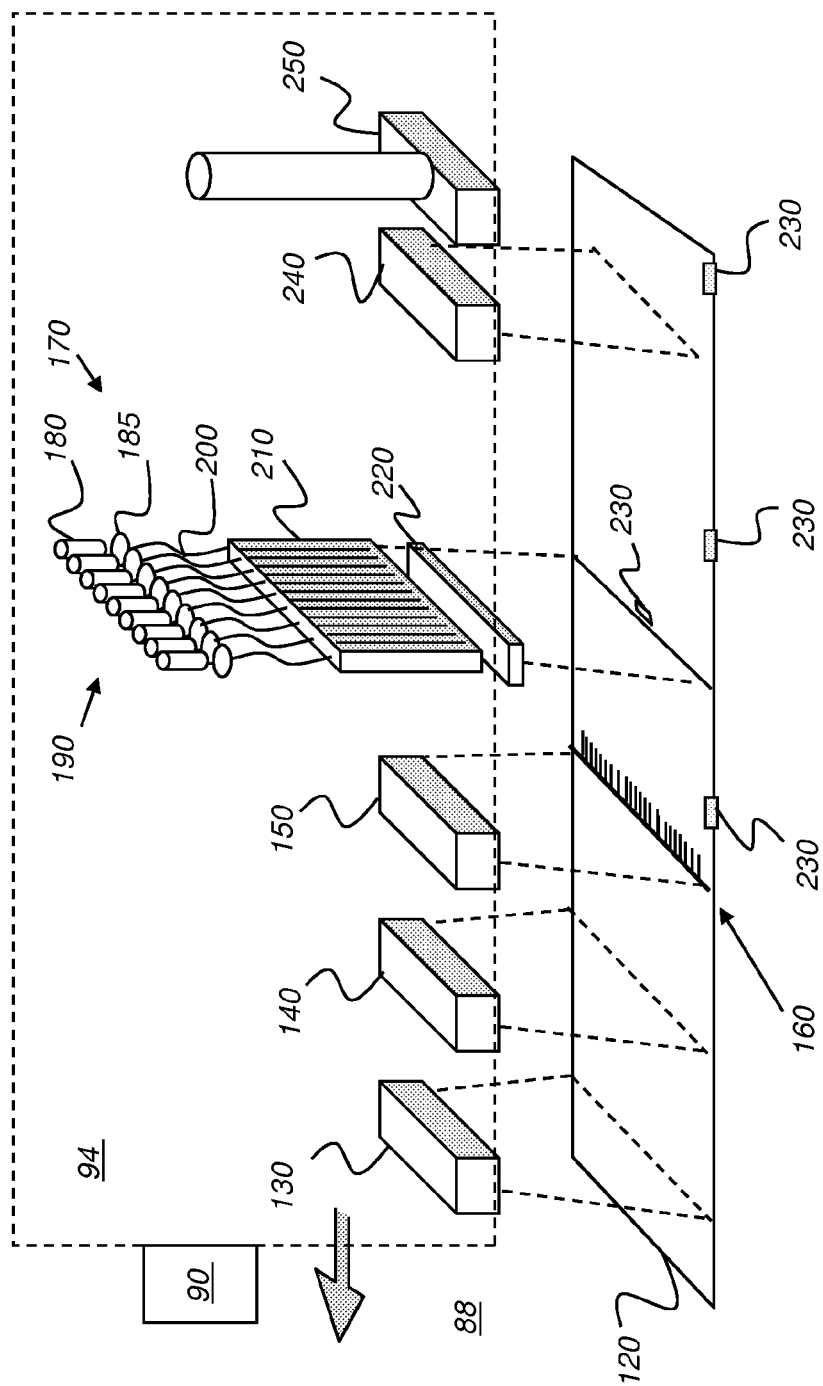
FIG. 1C is a schematic diagram showing a printing and curing system for use with electronic ink, wherein printing and illumination apparatus move past a stationary substrate.

Transport apparatus 90 more generally provides relative motion for forming a pattern and can also operate wherein substrate 120 is stationary and one or more of energizable surface conditioning, printing, and curing components, such as apparatus 130, 140, 150, 170, 240, and 250 are swept along the surface of substrate 120 to perform pattern deposition and curing operations. FIG. 1C is a schematic diagram showing an alternate embodiment with a printing and curing system 88 for use with electronic ink, wherein printing and illumination apparatus 150 and 170 and other components are coupled together as part of a pattern forming apparatus 94 that moves past a stationary substrate 120. Transport apparatus 90 may include a leadscrew or may be belt-driven, for example. A dashed box indicates pattern forming apparatus 94. Transport apparatus 90 moves pattern forming apparatus 94 from right to left across substrate 120 in the arrangement of FIG. 1C.

Washing or cleaning step 20 in the sequence of FIG. 1A consists of cleaning the substrate with solvents, or alternately with surface treatments such as using corona discharge energy or treating with compressed gases or other methods. It is found that the method of the present invention is particularly suitable for, but not limited to, use with a number of substrates including PET (polyethylene terephthalate), PI (Polyimide), PE (polyethylene), PP (Polypropylene), PVA (poly-vinyl alcohol), SiN (silicon nitride), ITO (indium tin oxide) and glass. In general, substrates need to be sufficiently clean in order to fully accept and cure the printed ink materials. Failure to clean the substrate, either in line, by energizing substrate cleaning apparatus 130 as depicted in the process of FIG. 1B, or prior to printing using some other method, can lead to poor adhesion, degraded electrical performance, material contamination, and breakage.

According to an embodiment of the present invention, the substrate 120 material is transported by means of transportation apparatus 90 (FIG. 1B) and moved through system 80 in a roll-to-roll, flat, sheet-fed, drum-fed, continuous, or stop-and-start sequence. Along the transportation system are placed one or more tracking elements such as reflectors or sensors 230. Tracking elements provide optical or electrical feedback as to the alignment of the elements of the printing chain. For example, reflections of a tracking element in the curing process can determine curing accuracy and substrate position. Sensors 230 can be placed under the substrate in the assembly or along edges of the substrate, as long as the illuminating wavelength reaches the sensor 230.

Temperature control element 100 (FIG. 1B) may be a simple heat sink or may be an apparatus designed to heat and cool the substrate to a desired temperature, integrated into transport apparatus 90. Maintaining temperature becomes a concern, since heated substrates can expand or shrink under different temperature conditions, with the risk of deformation of substrate or end-printed structures. Furthermore, as heat energy from the illumination system 170 can cause spatial temperature variations, spatially varying the temperature may be useful for certain applications.

Optional coating step 30 in the FIG. 1A sequence prepares the surface with adhesion promoting materials. Coatings, applied by energizing coating apparatus 140 in FIG. 1B, can be uniformly deposited, such as by aerosol application, roll coating, or other methods. Alternately, coatings are deposited selectively by inkjet deposition, or other selective printing mechanism, such as aerosol jet. This step, while not required in all cases, can significantly enhance the ability of material to adhere to substrate 120. Selective deposition of adhesion promoting materials can further assist in delineation between electrically active printed electronic structures and passive sections of a printed region. Auxiliary drying equipment, not shown in the FIG. 1B or 1C embodiments, may also be provided to facilitate drying or solidifying of an applied coating.

Continuing with the FIG. 1A sequence, the nanoparticle ink is deposited onto the substrate in printing step 40. The ink is deposited by energizing nanoparticle ink printing apparatus 150. Nanoparticle ink printing apparatus 150 uses a suitable deposition method such as ink-jet, offset-lithography, screen printing, indirect or direct gravure, flexography, aerosol application, or some other method. The binder and/or coating present in the nanoparticle ink helps to provide an even distribution of the ink. The deposited layer can be of variable thickness and, in practice, is typically in the thickness range between about 0.05-50 μm, but would not be limited to this range.

Figure 2:
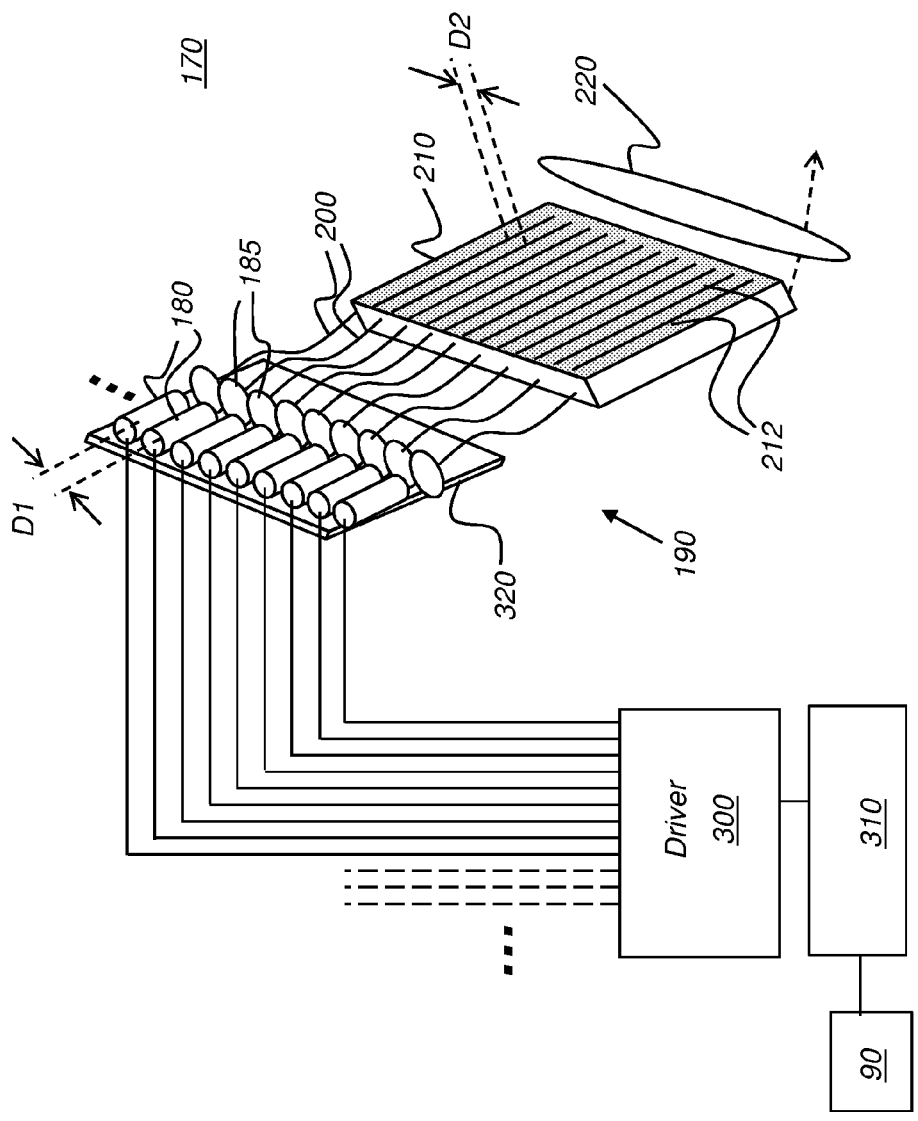
FIG. 2 is a schematic diagram that shows components of an illumination apparatus for a printing and curing system using a bank of laser diodes.

As shown in the perspective view of FIG. 2, drivers 300, under control of a control logic processor 310, provide the energizing signals for the individual laser diode 180 in each channel in illumination apparatus 170. A small number of laser diodes 180 are shown in FIG. 2. In embodiments of the present invention, numerous laser diodes 180 can be employed. Laser diodes 180 are provided with an optional heat sink 320. Each laser diode has corresponding coupling optics 185. An optical fiber 200 or other light guide then directs the generated laser light through coupling block 210 and lens 220. The laser diode 180 in each channel can be independently energized or de-energized as needed. This allows illumination apparatus 170 to direct light in a pattern, in conjunction with the operation and speed of transport apparatus 90. Advantageously, the pattern of illumination that is provided corresponds to the pattern of nanoparticle material that is applied by nano ink printing apparatus 150.

The use of laser light allows for the selection of a light wavelength that is well suited for the sintering of the nanoparticles while eliminating or minimizing damage to the coating. By using lasers, embodiments of the present invention apply monochromatic light to the substrate at wavelengths most favorable to sintering and other curing functions, without contributions from other wavelengths, such as lower wavelength light that can be heavily absorbed in the upper layers of deposited material. As noted earlier, absorption of wavelengths in upper layers nearest the surface can cause these upper layers to be inadvertently sealed, trapping binder and other materials that must be removed from beneath the surface. Advantageously, laser illumination provides sufficient energy for the removal of component materials in the precursor nanomaterial. This includes materials useful for improving ink application but not wanted in the final product, such as organic binders and particle coatings. With laser light, the spectral content and intensity can be specified and controlled so that the laser delivers the proper energy to the applied material, at the proper depth. In this way, problems such as unwanted sealing of top layers can be avoided.

Thermal characteristics of the substrate can complicate the task of sintering in a number of ways when conventional Xenon flash energy is used. Substrates having relatively high thermal conductivity, such as aluminum, silicon, and ceramic substrates, for example, can conduct the needed heat away from the area of incident light before sintering energy levels are reached. Polymer-based substrates, such as ITO coated plastic substrates, can be damaged due to the higher thermal conductivity of the ITO coating. Embodiments of the present invention help to address problems related to thermal response by using laser light that can be focused onto a small area.

Coupling of the laser light to each channel 212 within a coupling block 210, as shown in FIG. 2, is managed carefully, since reflections from the fiber can cause inadvertent mode hopping and other instabilities. Techniques for laser light routing and coupling to prevent these problems are well known to those skilled in the optical design arts. Optical fibers 200 extend to the coupling block 210, which may consist of a series of V-grooves in which the fibers are nested. Typical fibers include 50 um step core index fibers with a Numerical Aperture (NA) of 0.2. Choice of fibers takes into account that with lower Numerical Apertures, the laser light will have a greater depth of focus. Subsequent illumination lens 220 transmits the generated light. The spot profile of the directed laser beam can be round or slightly or highly elliptical, depending on the cross array imaging of the printing lens. Laser diodes in the array have a first distance D1 between them, determined by factors such as size of components and thermal considerations. Coupling block 210 and optical fibers 200 enable laser diode light channels to have a second distance D2 between them, wherein D2 is less than D1. Thus, features can be written at high resolution. Optical fibers are step-index optical fibers according to an embodiment of the present invention.

Commercially available solutions for driving the laser diode include using a 12 bit DAC that provides a high speed amplifier driving current to each channel or a constant current source switching between the diode laser and a dummy load to ensure a fast enough rise time, such as a <50 ns rise time. The driver can use single pulses of light to deliver desired peak intensity as well as to deliver total energy at a given level. Amplitude modulation may be used. Additionally, due to the quick rise time, pulse width modulation, or some combination of modulation techniques, can be used to the deliver the desired energy.

The resolution of the printing structure can be further determined by the relative energy profile of the illumination beam at substrate 120 and the response of the applied ink material. By way of reference, in a dye sublimation printing system, a 50 um core fiber can produce a 2560 dpi (dots-per-inch) image, with a spot size of 1 um. Similarly, in a material curing system, the printed electronic element can be smaller than core beam size. This effect can be used to interlace wavelengths and to obtain smaller features.

Using fiber coupled lasers allows a number of advantages, including a measure of thermal isolation. The local temperature of the diode and drivers can be separated from the printing environment. By mounting and spacing the laser diodes appropriately, feedback and jitter can be minimized. Using modular design techniques, laser assemblies can be readily replaced. Embodiments of the present invention use one of several ways to monitor diode operation. One technique is to maintain a feedback loop within driver 300 for adjusting drive current to within prescribed values. Alternately, feedback from the illumination incident on the substrate surface is used.

According to an embodiment of the present invention, diode laser arrays are formed of diodes having different emission wavelengths, wherein the emission wavelengths of at least two of the laser diodes in the array differ from each other by more than 25 nm. By spacing optical fibers 200 in the coupling block 210, the subsequent illumination lens 220 accommodates accurate spot placement for each wavelength. There can be some trade-off of spot size verses proximity between the different wavelengths. The focal spot size can also vary as a function of wavelength.

Advantageously, separate channels can be addressed simultaneously or sequentially. With simultaneous addressing, printing relies on the difference in required curing wavelengths for different materials. For example, ink having high copper (Cu) content tends to cure with applied energy in the near infrared, whereas some inks high in silicon require shorter wavelengths.

When driving laser diodes, pulse width modulation (PWM) can be used for controlling power levels and for temporally interspersing the illumination wavelengths. This permits the use of different wavelengths, both to cure different materials and to provide curing energy at different depths. For example, a longer wavelength can be useful for curing material at a greater depth. Wavelengths that have been found to be suitable for curing include, but are not limited to: 193 nm, 248 nm, 308 nm, 355 nm, 488 nm, 532 nm, 808 nm, 860 nm, 975 nm, 1064 nm, and $CO_2$ laser wavelengths.

Nanoparticle Ink Formulations

The printed electronic structures that can be formed by the present method are made of a metal or semi-metal, such as semiconductor material. Suitable metals for printing and curing in a pattern include, but are not limited to, copper, gold, silver, nickel, and other metals and alloys. Semi-metal materials including silicon can also be used. Furthermore, silicon particles that have been doped to provide semiconducting behavior (for example, doped with phosphorous or arsenic) are also suitable. Therefore, the present method can be used in production of both electronic structures, such as connecting traces between devices, and semiconducting devices themselves.

The nanoparticle ink used in embodiments of the present invention comprises the metal or semi-metal with a binder or coating (typically organic). The binder or coating in the ink helps to prevent agglomeration and to maintain the surface area, which confers many of the advantageous properties of nanoparticles. The nanoparticles used in the ink formulation can be between 0.5-500 nm. Advantageously, therefore, the present invention can be implemented for a wide range of nanoparticle inks including those with larger particles which are often cheaper to produce. An example of a suitable ink is the commercially available CI-002 formulation sold by Intrinsiq Materials, Rochester, N.Y. As noted previously, inks need not be comprised solely of nanoparticles, but may contain a mix with at least some percentage of nanoparticles, as described previously, and larger particles.

The high surface area of the nanoparticles is advantageous, so that the energy required to transform the nanoparticles in the ink, such as by sintering or curing, is less than for bulk materials. Therefore, as the laser illumination not only removes the coating or binding materials in the ink formulation, it also causes a transformation of the material. Upon receiving the illumination energy, the individual metal/semi-metal nanoparticles bond to form a metal/semi-metal structure, in the form of a densified metal or semi-metal film (depending on the material of the nanoparticle ink). As the laser illumination can be focused to a small spot size, the metal structure that is formed is localized to areas impacted by the laser. The high degree of accuracy with which the laser can be directed results in the formation of the high resolution printed structures.

Each deposited material or ink can have different curing properties, responding differently to light of various wavelengths and intensities. Where multiple materials are deposited, it may be suitable to cure the different materials under the same conditions or to vary wavelength and intensity levels appropriately. According to an embodiment using a single illumination apparatus 170 as in FIG. 1B, for example, each laser diode 180 has the same wavelength, with variation in wavelength within the laser array to within no more than about +/−1 nm of a nominal wavelength, but the intensity of the directed illumination changes, depending on the spatial position of apparatus 170 relative to the substrate 120 surface. Individual laser diodes 180 can be energized at different power levels over different portions of the applied pattern of printed elements 160. Exposure duration can also be modified, such as by varying the transport speed of transport apparatus 90 or using pulse-width modulation, for example. According to an alternate embodiment of the present invention, laser diode array 190 has laser diodes 180 of different wavelengths, suitably positioned for providing energy to the applied pattern of printed elements 160.

Referring again to the sequence of FIG. 1A, once the laser diode array 190 has finished illuminating the substrate and the desired image has been cured, the untransformed material is removed in removal step 60. The ink that has been scanned by the laser beam is transformed, typically by curing or sintering depending on the strength of the laser and length of exposure. The properties of the transformed, densified metallic structure differ from the untransformed structure. It is possible to select washing formulations and processes in removal step 60 to remove untransformed, unbounded, or uncured materials from the substrate surface while having little or no impact on cured regions. Such washing formulations are well known in the art of photolithography.

It is found that the present method is particularly suitable for a number of substrates including PET, PI, PE, PP, PVA, PI, SiN, ITO and glass. Therefore, the present application provides an improved method for producing high resolution lines compared to other systems. In particular, the direct transformation (curing, sintering or otherwise) of the material by the laser allows for higher resolution features, reduces or avoids the need for adding further layers such as photoresist layers and requires fewer stages to produce than do conventional methods. Printing and curing of electronic materials and components can be performed at low volumes as well as for large-scale, high volume production.

Figure 3:
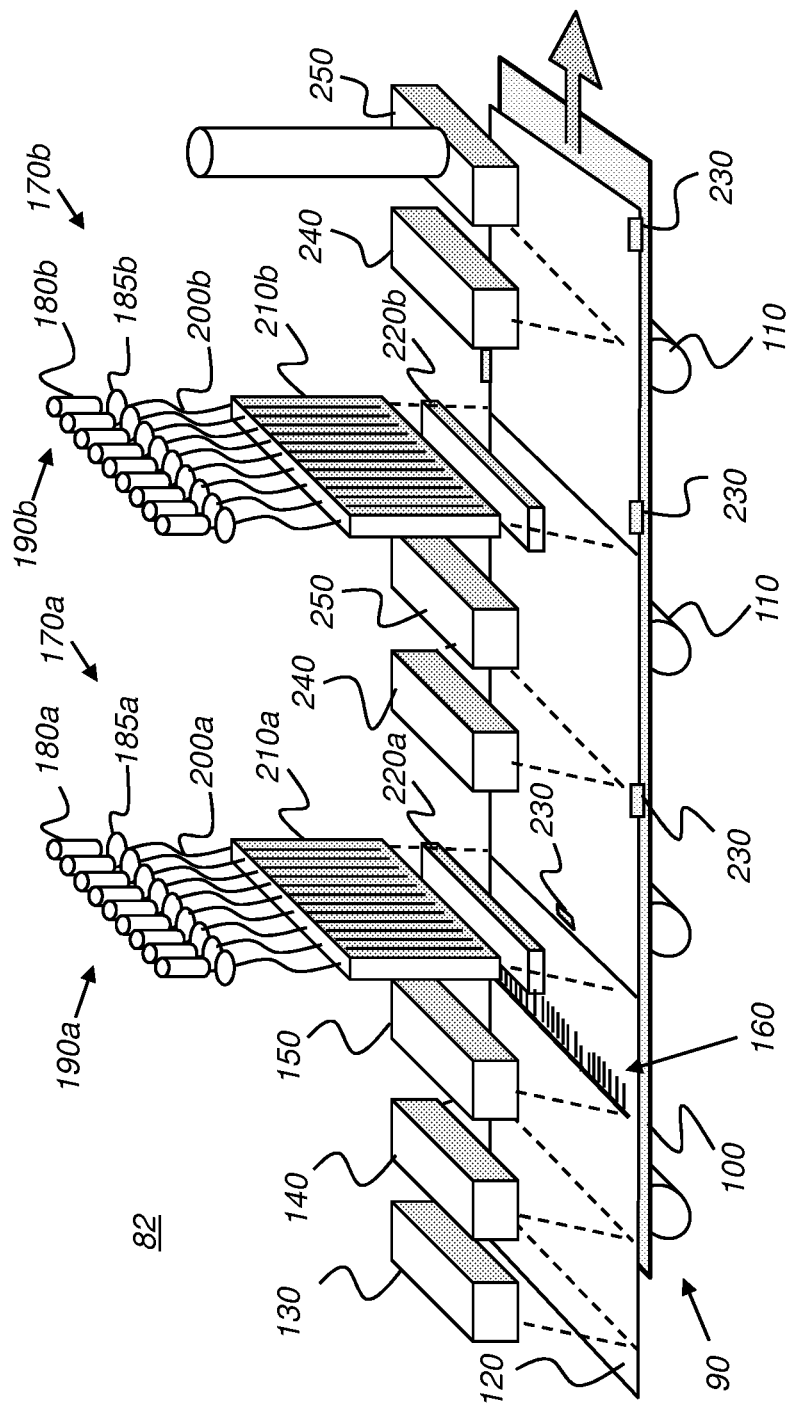
FIG. 3 is a schematic diagram showing a printing and curing system using two illumination apparatus for use with nanoparticle-based electronic ink.
Figure 4:
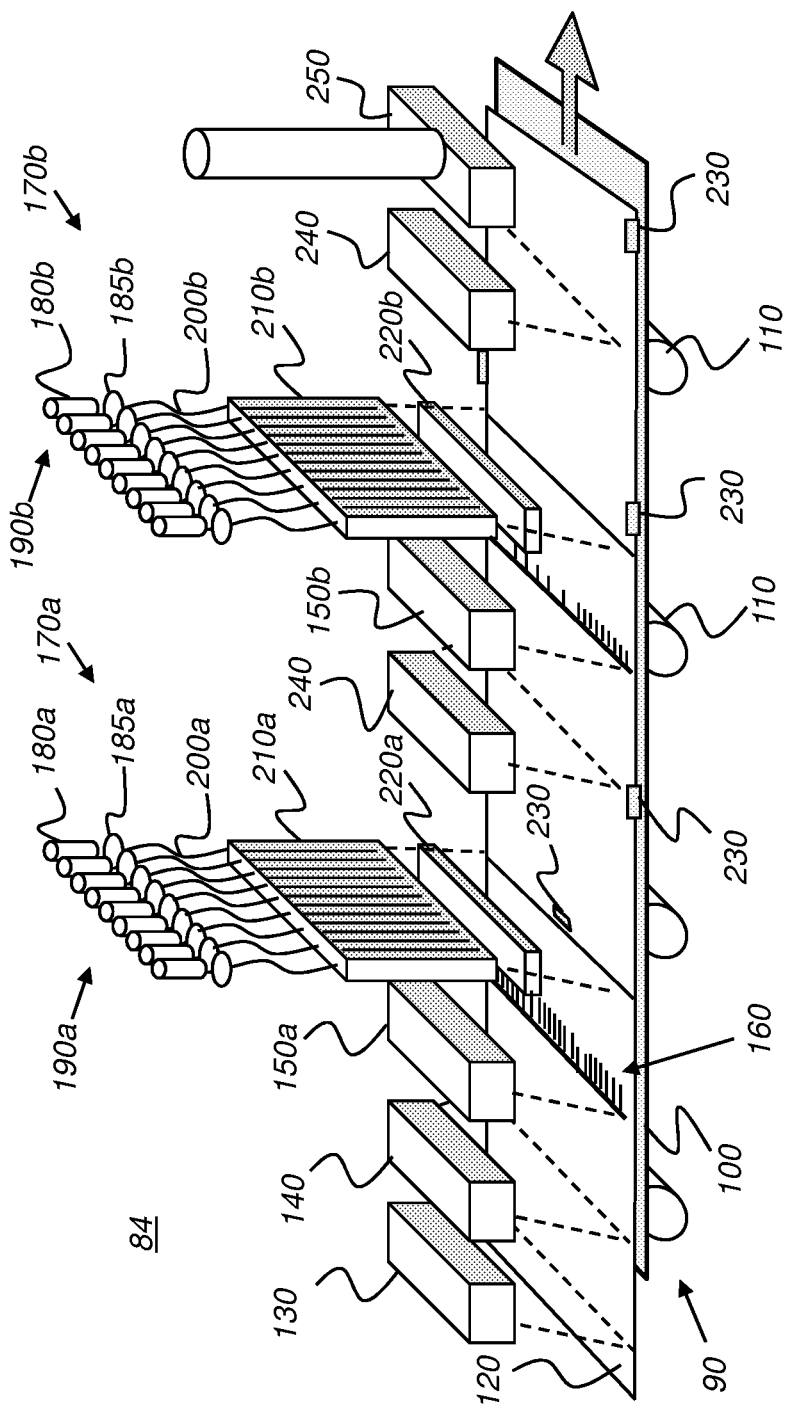
FIG. 4 is a schematic diagram showing a printing and curing system using two printing apparatus and two illumination apparatus for use with electronic ink.

The schematic diagrams of FIGS. 3 and 4 show alternate embodiments of the present invention for depositing more than a single material. Processing using these systems repeats portions of steps 40, 50, and 60 in the FIG. 1A sequence.

In an alternate embodiment of a printing and curing system 82 as shown in FIG. 3, multiple separate illumination diode arrays 190a and 190b are used to provide extra spatial coverage and/or different illuminators, such as diodes of different wavelength. An illumination apparatus 170a has a bank of multiple laser diodes 180a that are energizable to direct light through coupling optics 185a to optical fibers 200a, coupling block 210a, and an illumination lens 220a. Similarly, an illumination apparatus 170b has a bank of multiple laser diodes 180b that are energizable to direct light through coupling optics 185b to optical fibers 200b, coupling block 210b, and an illumination lens 220b. Using separate illumination apparatus 170a and 170b allows each of the subsequent illumination lenses 220a and 220b to be of simpler design, since the respective wavelength spread for each lens can be minimized. The arrangement of printing and curing system 82 is further beneficial where particular printed areas of substrate 120 may need additional illumination or where there is component failure in one of illumination apparatus 170a or 170b.

Also shown in the embodiment of printing and curing system 82 in FIG. 3 are multiple washing apparatus 240 and exhaust elements 250 for removing volatilized material. Optionally, one set of washing and exhaust elements may suffice depending on factors such as material characteristics and transport speed.

In an alternate embodiment, of a printing and curing system 84 as shown in FIG. 4, multiple printing apparatus 150a, 150b are used, along with corresponding illumination diode arrays 190a, 190b. This arrangement allows additional spatial coverage for depositing the same material, including deposition at different feature sizes, or depositing and curing different nanoparticle ink materials, such as materials with different viscosities, requiring different preconditioning or curing, or having other different characteristics. Printing apparatus 150a and 150b can be the same type or different types of print systems. For example, the first apparatus 150a may be an inkjet printer, and the second apparatus 150b a gravure printer. In the particular embodiment shown in FIG. 4, two washing apparatus 240 and a single exhaust element 250 are shown; alternate embodiments with different numbers and arrangements of these support systems can also be provided, as described previously. The use of multiple illumination apparatus 170a and 170b provides the same advantages described with reference to FIG. 3. In addition, further coatings may be applied between printed layers of nanoparticle materials, such as an insulating coating, for example.

Figure 5:
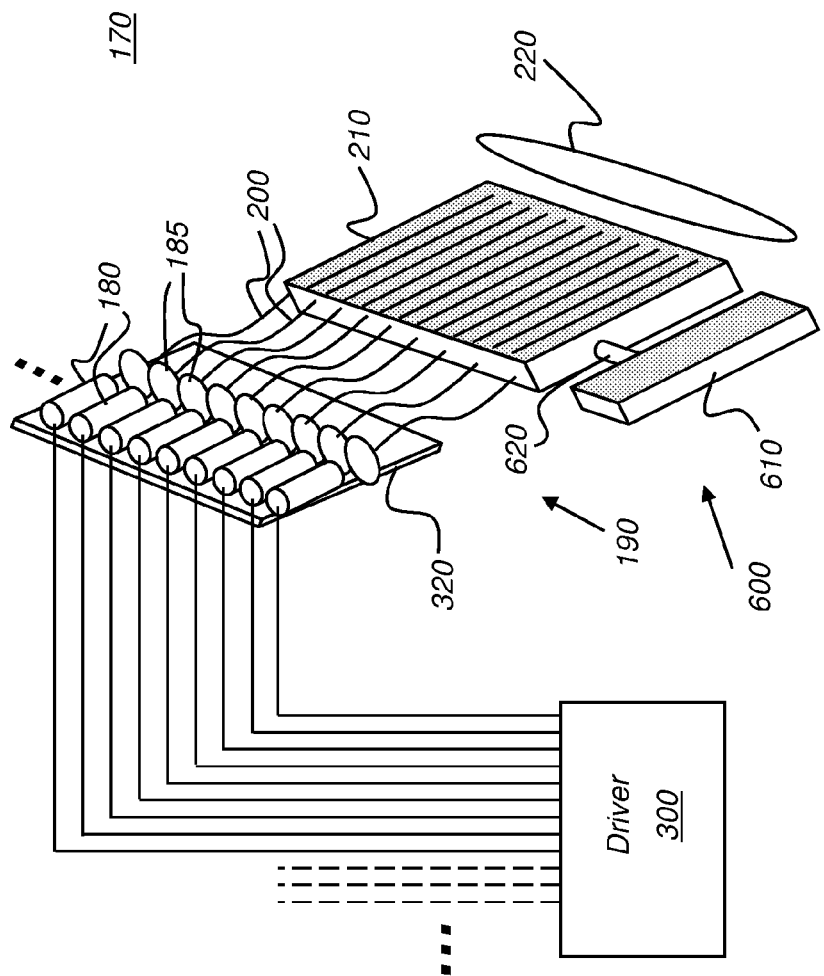
FIG. 5 is a schematic diagram showing an illumination apparatus having a mechanical dithering component.
Figure 6:
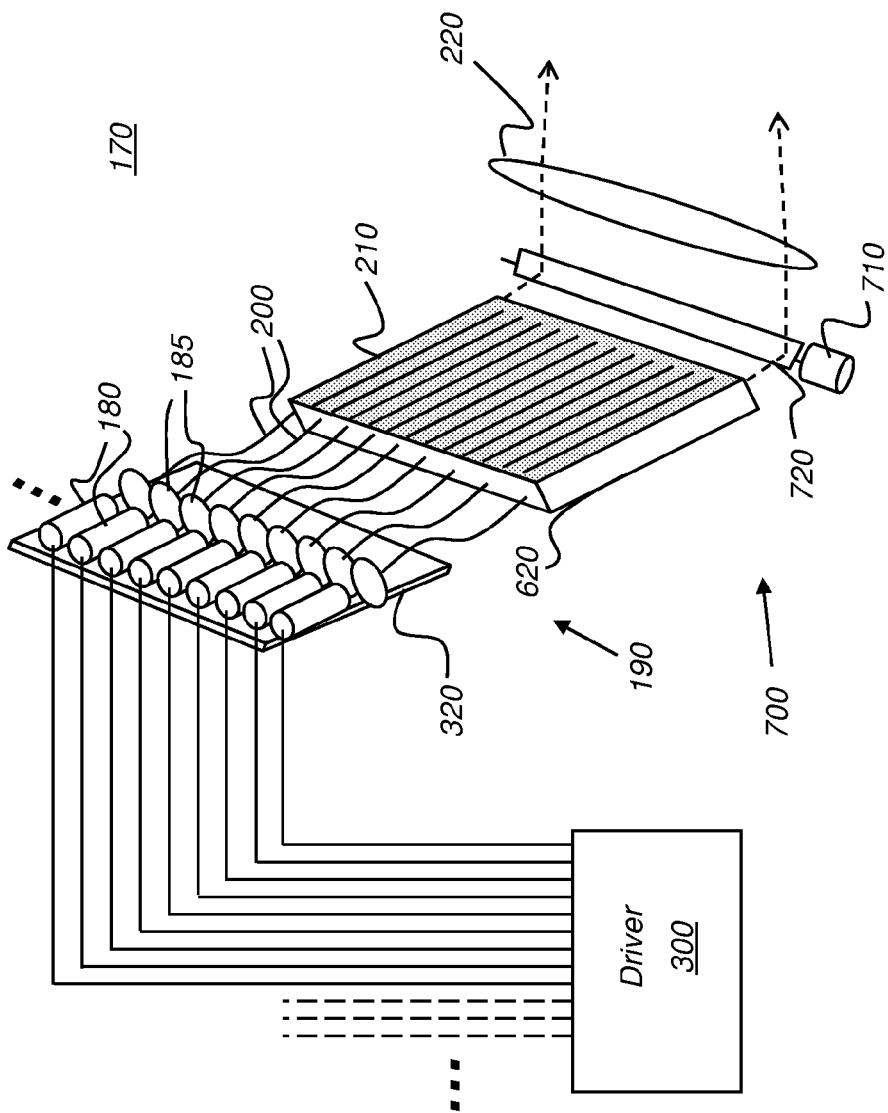
FIG. 6 is a schematic diagram showing an illumination apparatus having an optical dithering component prior to the illumination lens.
Figure 7:
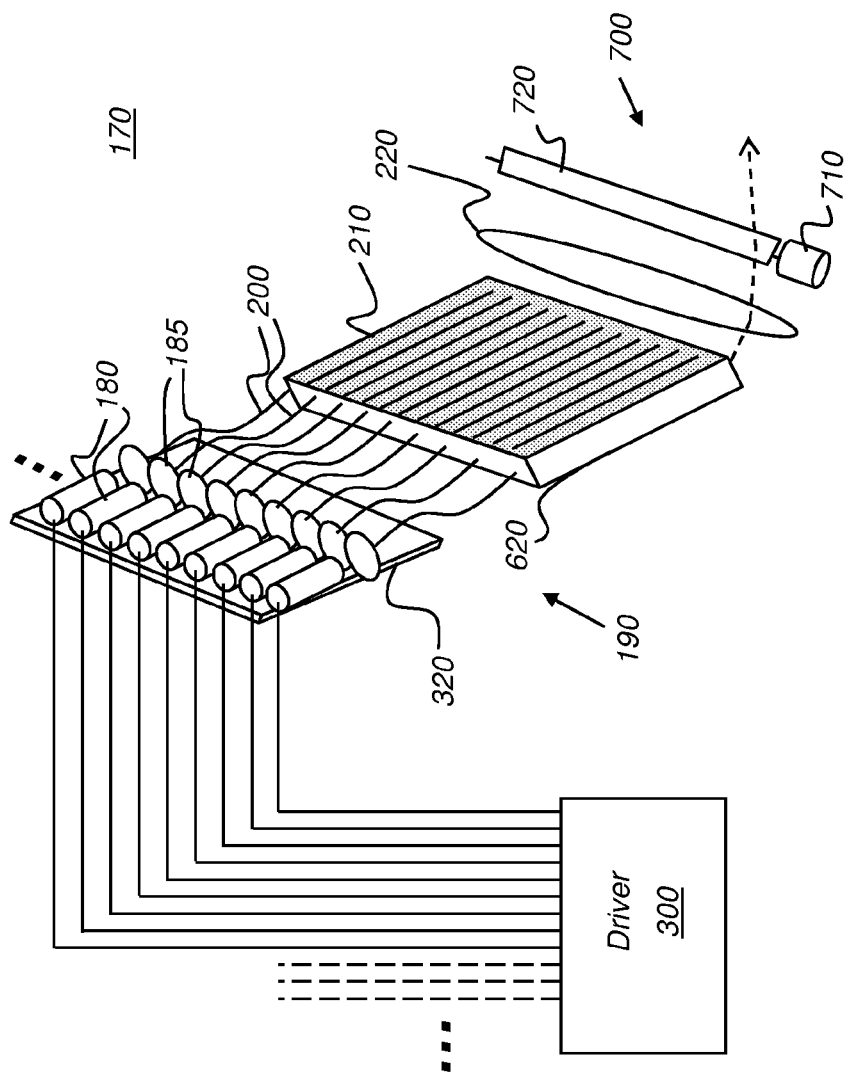
FIG. 7 is a schematic diagram showing an illumination apparatus having an optical dithering component after the illumination lens.

According to an alternate embodiment of the present invention, the illumination that is used for curing is spatially dithered, or moved rapidly between nearby positions at a high rate of speed. Dithering can be advantageous for increasing the area coverage of laser light beams where there are a limited number of light sources and for reducing excessive patterning or other unwanted effects of the illumination system. Embodiments of FIGS. 5, 6, and 7 show various mechanisms that are energizable for dithering and that can be used for one or more of illumination apparatus 170, 170a, or 170b in the embodiments shown in FIGS. 1B, 3, and 4. The schematic view of FIG. 5 shows one type of mechanical dithering apparatus 600 that has an actuator 610 with a coupling 620 to optical coupling block 210. According to an embodiment of the present invention, actuator 610 is a piezoelectric actuator that causes dithering by rapidly vibrating coupling block 210. Alternately, actuator 610 can be coupled to other appropriate elements in the optical system.

Spatial dithering can include the illumination lens 220 assembly or can be within the field of view of the lens assembly. FIG. 6 depicts an optical dithering apparatus 700. To provide dithering, a mirror element 720 is coupled to an energizable actuator 710 to provide translation in either or both linear and rotational directions, optically redirecting the illumination in the optical path preceding the lens 220 assembly. This requires that the dithered light falls within the field of the lens. In an alternate embodiment shown in FIG. 7, the optical dithering apparatus 700 is introduced in the optical path following illumination lens 220. This design requires a sufficient depth of focus and focal length.

In cases involving dithering, alignment tracking is useful to help provide the illumination over the intended area. Sensors 230 and related components (FIGS. 1B, 3, 4) help to provide the needed alignment tracking.

Embodiments of the present invention advantageously allow high resolution features to be produced in a single stage process. In particular, the invention avoids the need for an extra layer, such as a photoresist layer, and its subsequent processing. Furthermore, unlike photoresist methods, the method of the present invention does not require the use of etchants to remove the unprotected, uncured structure. This is advantageous as it simplifies the production process. In addition, embodiments of the present invention allow a measure of accuracy with direct placement of electronic traces and structures. It is known, for example, that etchants used in conventional electronic patterning can result in excessively sloped tracks or undercut, whereas the use of lasers to directly cure/transform the material allows for well-defined edges to be formed.

The invention has been described in detail with particular reference to certain preferred embodiments thereof, but it will be understood that variations and modifications can be effected within the scope of the invention.

The invention claimed is:

1. An apparatus for forming a pattern of a nanoparticle-based ink on a substrate, the apparatus comprising:
   a printing apparatus that is energizable to deposit the nanoparticle-based ink in a pattern on a surface of the substrate;
   an illumination apparatus that is energizable to direct a patterned illumination to cure the deposited ink pattern on the substrate, the illumination apparatus having:
   (i) an array having at least a first and a second laser diode, each laser diode coupled to a channel in a laser light coupling element through an optical fiber; and
   (ii) an illumination lens disposed to direct illumination from the coupling element onto the surface of the substrate; and
   a transport apparatus that is energizable to provide relative motion between the substrate and the illumination apparatus.

2. The apparatus of claim 1 wherein the printing apparatus is taken from the group consisting of an inkjet printer, a gravure printer, an offset printer, a screen printer, a flexography printer, and an aerosol application device.

3. The apparatus of claim 1 wherein each laser diode in the array has the same wavelength to within no more than about +/−1 nm.

4. The apparatus of claim 1 wherein the at least first and second laser diodes in the array have wavelengths that differ by more than 25 nm.

5. The apparatus of claim 1 wherein the optical fibers are step-index optical fibers.

6. The apparatus of claim 1 wherein the at least first and second laser diodes are amplitude-modulated.

7. The apparatus of claim 1 wherein the at least first and second laser diodes are pulse-width modulated.

8. The apparatus of claim 1 further comprising a coating apparatus that is energizable to coat the substrate for adhesion of the nanoparticle-based ink.

9. The apparatus of claim 1 wherein the illumination apparatus further comprises a dithering apparatus.

10. The apparatus of claim 1 wherein the illumination apparatus is a first illumination apparatus and further comprising a second illumination apparatus that directs illumination to the patterned substrate surface.

11. The apparatus of claim 10 wherein the second illumination apparatus provides light having a wavelength different from that of the first illumination apparatus by at least 25 nm.

12. An apparatus for forming a pattern of a nanoparticle-based ink on a substrate, the apparatus comprising:
   a transport apparatus that is energizable to move the substrate in a direction;
   a printing apparatus that is energizable to deposit the nanoparticle-based ink in a pattern on a surface of the moving substrate; and
   an illumination apparatus that is energizable to direct a patterned illumination to cure the deposited ink pattern on the moving substrate, the illumination apparatus having:
   (i) an array having at least a first and a second laser diode, each laser diode coupled to a channel in a laser light coupling element through an optical fiber; and
   (ii) an illumination lens disposed to direct illumination from the coupling element onto the surface of the moving substrate.

13. The apparatus of claim 12 wherein the at least first and second laser diodes are amplitude-modulated.

14. The apparatus of claim 12 wherein the at least first and second laser diodes are pulse-width modulated.

15. The apparatus of claim 12 wherein the illumination apparatus further comprises a dithering apparatus.

16. The apparatus of claim 12 wherein the illumination apparatus is a first illumination apparatus and further comprising a second illumination apparatus that directs illumination to the patterned substrate surface.

* * * * *